United States Patent
Chang et al.

(10) Patent No.: US 9,224,947 B1
(45) Date of Patent: Dec. 29, 2015

(54) RESISTIVE RAM AND METHOD OF MANUFACTURING THE SAME

(71) Applicant: Winbond Electronics Corp., Taichung (TW)

(72) Inventors: Shuo-Che Chang, Taichung (TW); Sung-Ying Wen, Changhua County (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/492,096

(22) Filed: Sep. 22, 2014

(51) Int. Cl.
*H01L 27/115* (2006.01)
*H01L 45/00* (2006.01)
*H01L 27/11* (2006.01)
*H01L 49/02* (2006.01)

(52) U.S. Cl.
CPC ........ *H01L 45/1253* (2013.01); *H01L 45/1233* (2013.01); *H01L 45/16* (2013.01); *H01L 27/1112* (2013.01); *H01L 28/24* (2013.01)

(58) Field of Classification Search
CPC ........................... H01L 27/1112; H01L 28/24
USPC ................................................ 257/4; 438/382
See application file for complete search history.

(56) References Cited

U.S. PATENT DOCUMENTS

| | | | |
|---|---|---|---|
| 8,111,541 B2 | 2/2012 | Lai et al. | |
| 2011/0291066 A1 | 12/2011 | Baek et al. | |
| 2013/0001504 A1* | 1/2013 | Ninomiya et al. | 257/4 |
| 2013/0034947 A1* | 2/2013 | Hong et al. | 438/384 |
| 2013/0193396 A1* | 8/2013 | Nakano et al. | 257/4 |
| 2013/0214236 A1* | 8/2013 | Lu et al. | 257/4 |
| 2013/0320289 A1* | 12/2013 | Chen et al. | 257/4 |
| 2014/0264231 A1* | 9/2014 | Wang et al. | 257/4 |
| 2014/0353566 A1* | 12/2014 | Wang et al. | 257/2 |
| 2015/0179316 A1* | 6/2015 | Hsueh et al. | |

* cited by examiner

*Primary Examiner* — George Fourson, III
(74) *Attorney, Agent, or Firm* — Jianq Chyun IP Office

(57) ABSTRACT

A resistive RAM and a method of manufacturing the same are provided. The resistive RAM includes a first electrode, a second electrode, a transition metal oxide (TMO) layer between the first and second electrodes, an activated metal layer between the first electrode and the TMO layer, and a metal oxynitride layer formed on a surface of the activated metal layer in the gas environment containing oxygen and nitrogen elements.

12 Claims, 6 Drawing Sheets

US 9,224,947 B1

RESISTIVE RAM AND METHOD OF MANUFACTURING THE SAME

BACKGROUND OF THE DISCLOSURE

1. Field of the Invention

This invention relates to a technique for a resistive RAM (RRAM), and more particularly to a RRAM and a method of manufacturing the same.

2. Description of Related Art

In general, an RRAM includes a transition metal oxide (TMO), a top electrode (TE) and a bottom electrode (BE), and is connected to the outside via a top wire and a bottom wire. The RRAM switches a resistance state from 0 to 1 or from 1 to 0 by means of an external operating voltage/current. Since the conductive path is controlled by means of oxygen vacancies under a low resistance state (LRS), once oxygen ions diffuse into a TMO layer due to high temperature, the oxygen vacancies inside the conductive path would be reduced, so that operation of the RRAM becomes unstable.

Therefore, there have been a variety of techniques for reducing diffusion of the oxygen ions into the TMO, such as increasing a Set power, which, however, affects the yield for Reset. Moreover, there is a technique of using an oxide layer to block the diffusion of the oxygen ions, but it may impact on the conductivity of the memory as a whole.

Among various RRAMs, an RRAM having hafnium oxide as the TMO layer receives much attention due to excellent durability and high switching speed. However, it is often hard to retain a Ti/HfO$_2$ RRAM currently employed in LRS in high temperature, leading to deterioration in the so-called "high-temperature data retention" (HTDR). Thus, there is necessity for research and improvement in the RRAM.

SUMMARY OF THE INVENTION

An RRAM is provided to improve data retention and to enhance conductivity.

A method of manufacturing the RRAM is also provided, which manufactures a memory having a good yield for data retention and a low operating voltage.

One of exemplary embodiments comprises an RRAM including a first electrode, a second electrode, a TMO layer between the first and second electrodes, an activated metal layer between the first electrode and the TMO layer, and a metal oxynitride layer formed on a surface of the activated metal layer in the gas environment containing oxygen and nitrogen elements.

Another of exemplary embodiments comprises a method of manufacturing the RRAM. The method includes forming a first electrode, forming a TMO layer on the first electrode, forming a second electrode on the TMO layer, forming an activated metal layer, and forming a metal oxynitride layer on a surface of the activated metal layer in the gas environment containing oxygen and nitrogen elements.

To make the above features and advantages of the invention more comprehensible, several embodiments accompanied with drawings are described in detail as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1A:
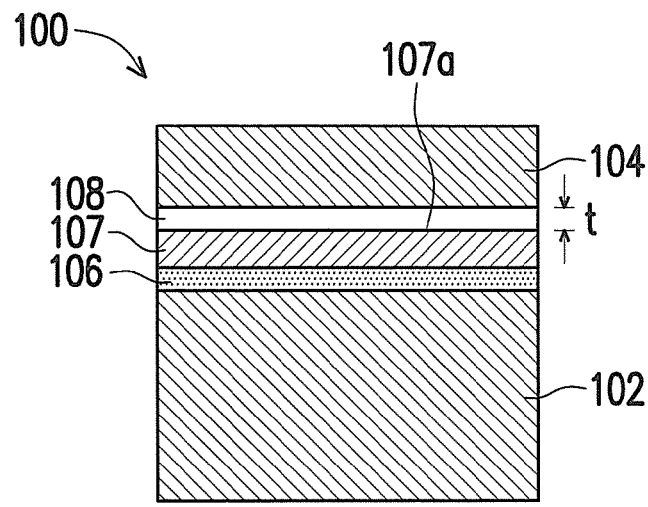
FIGS. 1A to 1E are cross-sectional schematic views of five RRAMs according to an embodiment of the invention.

The concept of the invention may be more sufficiently understood with reference to the drawings that show the embodiments of the invention. However, the invention may be realized in many different fours and should not be explained to be limited to the embodiments described below. In fact, the embodiments provided below serve merely to elaborate the invention more completely and in detail, and to fully convey the scope of the invention to persons having ordinary skills in the art.

In the drawings, the size and relative size of each layer and area may be illustrated in exaggeration for the sake of clarity.

FIGS. 1A, 1B, 1C, 1D and 1E are respectively cross-sectional schematic views of five RRAMs according to an embodiment of the invention.

Referring to FIG. 1A, an RRAM 100 includes a second electrode serving as a bottom electrode (BE) 102, a first electrode serving as a top electrode (TE) 104, and a transition metal oxide (TMO) layer 106 between the first and second electrodes 104 and 102. The TE 104 (first electrode) and the BE 102 (second electrode) may respectively be a layer made of materials such as Ti, Ta, TiN, TaN or the like, while a material of the TMO layer 106 may be HfO$_x$ or other adequate metal oxides. Thicknesses of the TE and BE 104 and 102 are respectively, for example but not limited to, 10 nm to 100 nm. On the other hand, the thickness of the TMO layer 106 is, for example but not limited to, 3 nm to 11 nm.

In FIG. 1A, the RRAM 100 further includes an activated metal layer 107 and a metal oxynitride layer 108, wherein the activated metal layer 107 is between the TE 104 (first electrode) and the TMO layer 106, while the metal oxynitride layer 108 is formed on a surface 107a of the activated metal layer 107 in the gas environment containing oxygen and nitrogen elements for blocking oxygen ions in the activated metal layer 107 from diffusing to the TE 104 (first electrode). In this embodiment, the material of the activated metal layer 107 is, for example, Ti, Ta, W, Hf, Ni, Al, V, Co, Zr or Si; the thickness of the activated metal layer 107 is between about 5 nm to 45 nm; the material is preferably Ti or Ta. Because this metal oxynitride layer 108 is not formed by deposition, a thinner film layer can be obtained than a traditional deposition process such as sputtering and so on. For example, a thickness "t" of the metal oxynitride layer 108 is between about 1 nm to 20 nm. A ratio of oxygen to total atoms in the metal oxynitride layer 108 is between about 10% and 60%, while a ratio of nitrogen to the total atoms is between about 15% and 60%, for instance.

Figure 1B:
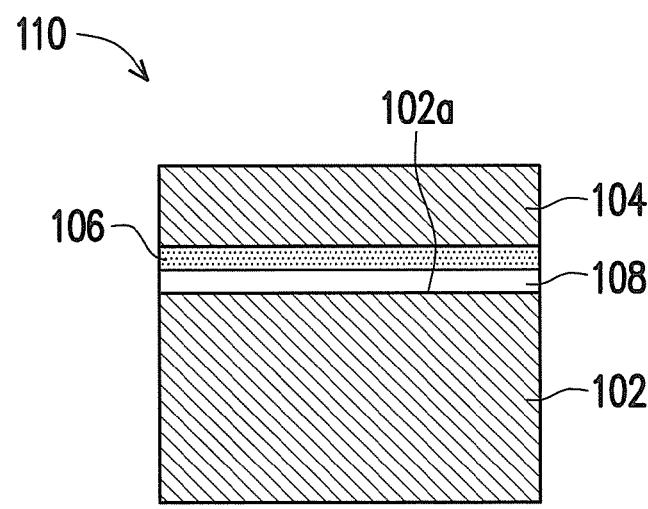

Next, referring to FIG. 1B, an RRAM 110 as shown herein takes the BE 102 as the first electrode and the TE 104 as the second electrode. Furthermore, in the condition that the material of the BE 102 (first electrode) is identical with the material of the activated metal layer, the metal oxynitride layer 108 may be formed on a surface 102a of the BE 102. That is, the BE 102 in FIG. 1B may be deemed as both the first electrode and the activated metal layer, and therefore the activated metal layer is not shown in the figure. In the RRAM 110, the metal oxynitride layer 108 is used to block diffusion of oxygen ions in the TMO layer 106 to the BE 102 (first electrode). For parameters such as materials and thicknesses of other film layers, please also refer to FIG. 1A.

Figure 1C:
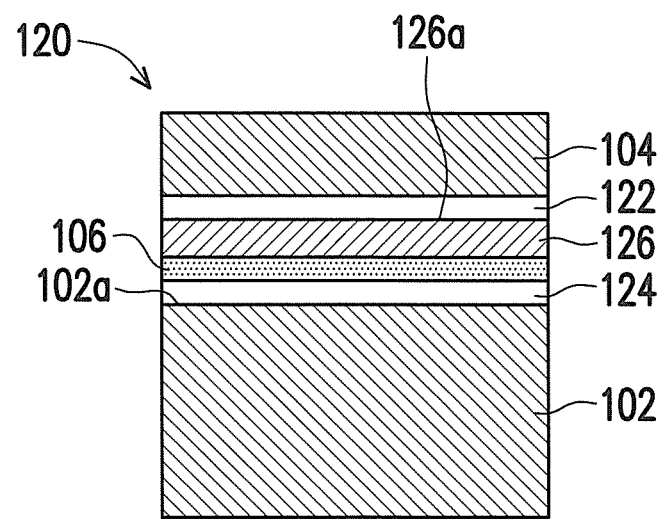

The features of FIGS. 1A and 1B are combined in an RRAM 120 of FIG. 1C. That is, a metal oxynitride layer 122 is disposed between the TE 104 and the TMO layer 106, and a metal oxynitride layer 124 is also disposed between the BE 102 and the TMO layer 106. Herein, the metal oxynitride layer 122 is formed on a surface 126a of an activated metal layer 126 in the gas environment containing oxygen and nitrogen elements, and the metal oxynitride layer 124 is also formed on the surface 102a of the BE 102 made of an identical material with the activated metal layer in the gas environment containing oxygen and nitrogen elements. Therefore, the TMO layer 106 of the RRAM 120 is protected by the metal oxynitride layers 122 and 124 thereon and thereunder and has a more preferable effect than FIGS. 1A and 1B with respect to HTDR in LRS.

Figure 1D:
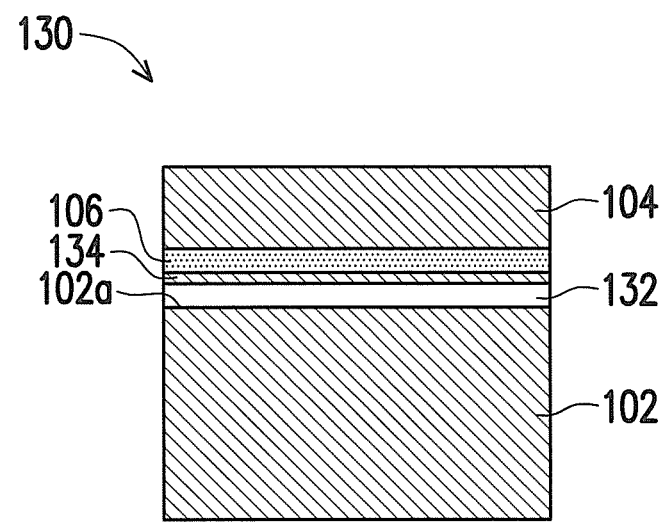

As regards an RRAM 130 of FIG. 1D, similar to the structure in FIG. 1B, the RRAM 130 has a metal oxynitride layer 132 formed on the surface 102a of the BE 102 in the gas environment containing oxygen and nitrogen elements. But the difference lies in that a first buffer layer 134 is disposed between the TMO layer 106 and the metal oxynitride layer 132. The material of the first buffer layer 134 may be identical with the material of the BE 102, so that the TMO layer 106 obtains more preferable electric and thermal conductive characteristics upon deposition.

Figure 1E:
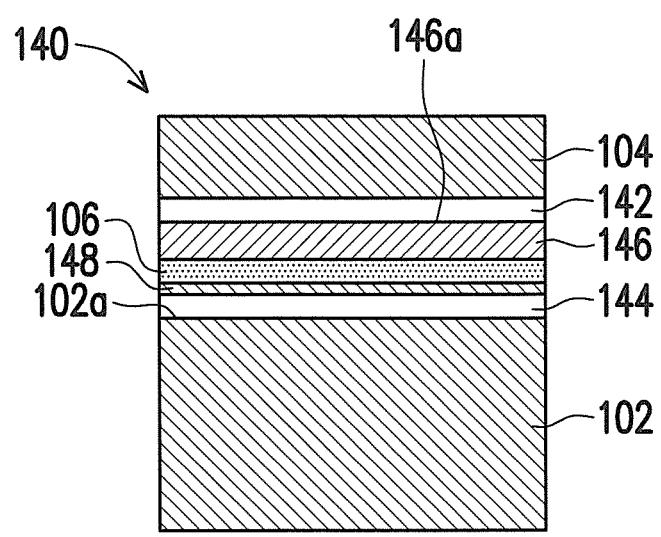

The features of FIGS. 1A and 1D are combined in an RRAM 140 of FIG. 1E. That is, a metal oxynitride layer 142 is disposed between the TE 104 and the TMO layer 106, and a metal oxynitride layer 144 is also disposed between the BE 102 and the TMO layer 106. Furthermore, a first buffer layer 148 is disposed between the TMO layer 106 and the metal oxynitride layer 144. Since the metal oxynitride layer 142 is formed on a surface 146a of an activated metal layer 146 in the gas environment containing oxygen and nitrogen elements, and the metal oxynitride layer 144 is also formed on the surface 102a of the BE 102 in the gas environment containing oxygen and nitrogen elements, data retention of the RRAM 140 is excellent.

The metal oxynitride layers in the above drawings are all formed in the gas environment containing oxygen and nitrogen elements. Therefore, to elaborate the manufacturing process of the metal oxynitride layer concisely, the embodiment below merely takes the structure of FIG. 1A for example, and the embodiment may be applied to manufacturing the structures of FIGS. 1B to 1E.

Figure 2A:
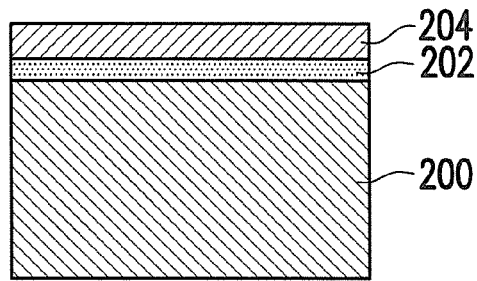
FIGS. 2A to 2C are cross-sectional views illustrating a process of manufacturing an RRAM according to another embodiment of the invention.
Figure 2B:
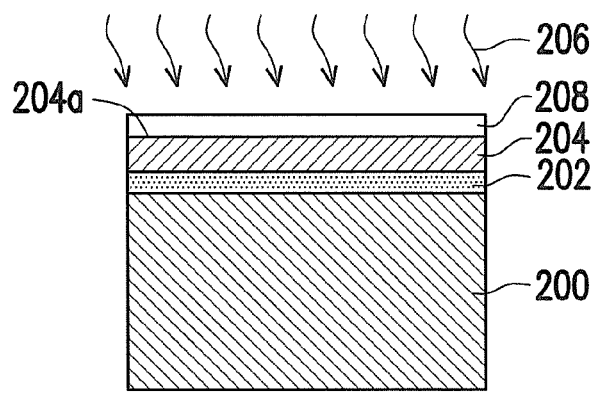
Figure 2C:
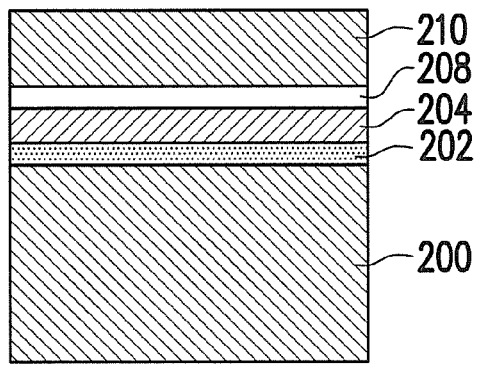

FIGS. 2A to 2C are cross-sectional views illustrating a process of manufacturing an RRAM according to another embodiment of the invention.

Referring to FIG. 2A, after forming a first electrode 200 and a TMO layer 202 in sequence, an activated metal layer 204 is formed. The first electrode 200 is a material layer of Ti, Ta, TiN, TaN, or the like, while the material of the TMO layer 202 is HfOx or other adequate metal oxide. The material of the activated metal layer 204 is, for example, Ti, Ta, W, Hf, Ni, Al, V, Co, Zr or Si; the material is preferably Ti or Ta.

Referring to FIG. 2B then, a metal oxynitride layer 208 is formed on a surface 204a of the activated metal layer 204 in an environment of gas 206 containing oxygen and nitrogen elements. In this embodiment, the gas 206 is, for example, at least one selected from the group consisting of $N_2O$, $NO_2$, $NO$, $N_2O_2$, $N_2/O_2$, $N_2/O_3$, $N_2$, $NH_3$, $O_2$, $H_2O$, $H_2O_2$ and $O_3$, wherein the slash "/" means containing both gases. For instance, one single gas 206 containing oxygen and nitrogen elements may be used to form the metal oxynitride layer 208, or different gases 206 may be inputted simultaneously, such as oxygen ($O_2$) and nitrogen ($N_2$), but it is not limited thereto. Different gases 206 may also be inputted in sequence. The process of inputting the gas 206 may be with or without plasma. Due to the plasma, a reaction time may be shortened or a thicker metal oxynitride layer may be formed.

Next, referring to FIG. 2C, a second electrode 210 is formed on the metal oxynitride layer 208, so that an RRAM as in FIG. 1A is obtained.

To manufacture the RRAM of FIG. 1B, an activated metal layer needs to be formed after the step of forming the first electrode (200). Furthermore, when the first electrode and the activated metal layer are made of the same material, the two layers may be deemed as one layer of the same material, and the step as in the above FIG. 2B is performed to form a metal oxynitride layer. Subsequent steps are available in the prior art and are not repeated herein.

To manufacture the RRAM of FIG. 1D, a first buffer layer is formed on the metal oxynitride layer after framing a metal oxynitride layer. Other steps are available in the above techniques and are not repeated herein.

Figure 3:
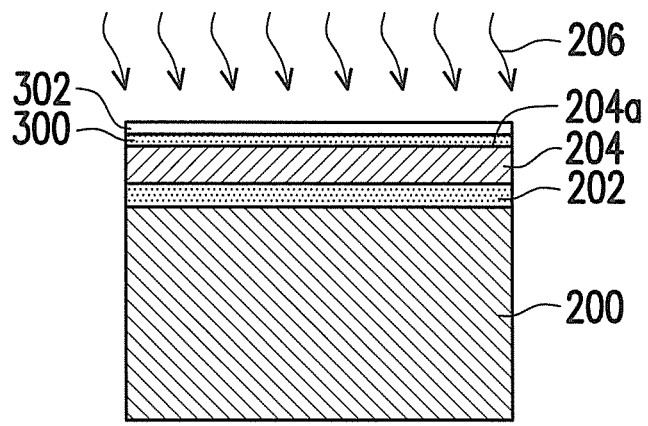
FIG. 3 is a cross-sectional view of an RRAM during a manufacturing process according to yet another embodiment of the invention.

However, the method of the invention is not limited to above steps. Before foaming the metal oxynitride layer, a second buffer layer 300 may be formed on a surface 204a of an activated metal layer 204, as shown in FIG. 3. Then, a metal oxynitride layer 302 is formed in a gas 206 environment containing oxygen and nitrogen elements. Therefore, the second buffer layer 300 is disposed on the surface 204a and contacts the metal oxynitride layer 302 directly. The second buffer layer 300 is, for example, an extra-thin TiN layer, $TiO_x$ layer (x<2), $TiN_xO_y$ layer (x and y are not 0 and x+y<2) manufactured by sputtering deposition, etc. The second buffer layer 300 may mitigate a reaction rate of the metal oxynitride layer 302.

Several experiments are provided below to verify the effects of the invention, but the experiments do not serve to limit the scope of the invention.

Experiment Example 1

An RRAM as in FIG. 1A is manufactured, wherein a metal oxynitride layer is made of titanium oxynitride, and the titanium oxynitride layer is formed by activating metallic Ti under 300° C. for 5 minutes in the gas environment containing oxygen and nitrogen elements and has a thickness of 5 nm.

Comparative Example 1

An RRAM as in the Experiment Example 1 is manufactured, but the metal oxynitride layer is omitted.

Comparative Example 2

An RRAM as in the Experiment Example 1 is manufactured, wherein the metal oxynitride layer is replaced with an aluminum oxide layer having a thickness of about 1.5 nm.

Result 1: Data Retention

Figure 4:
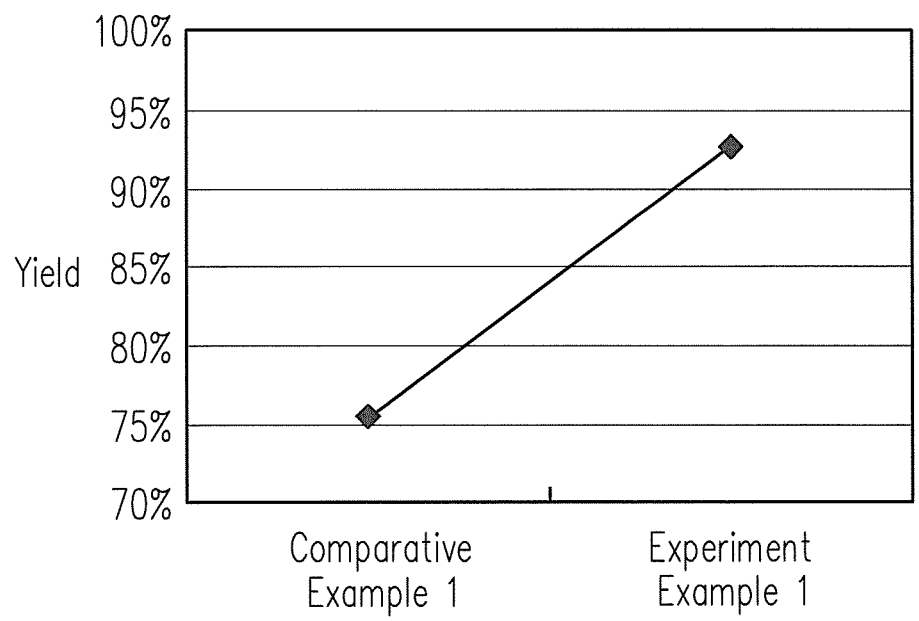
FIG. 4 is a comparative curve diagram of an Experiment Example 1 and a Comparative Example 1 with respect to yield for data retention.
Figure 5:
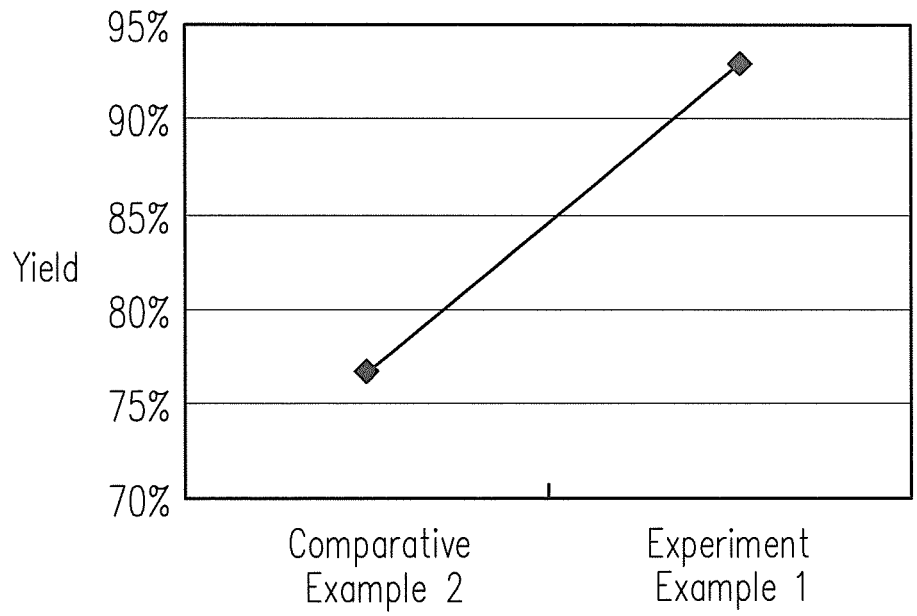
FIG. 5 is a comparative curve diagram of the Experiment Example 1 and a Comparative Example 2 with respect to yield for data retention.

After high-temperature thermal treatment (i.e. baking), a yield of data retention is measured, and the results are shown in FIGS. 4 and 5.

It is learned from FIG. 4 that the yield of data retention in the Experiment Example 1 of the invention is obviously higher than that in the Comparative Example 1.

It is learned from FIG. 5 that the yield of original data retention in the Experiment Example 1 of the invention is obviously higher than that in the Comparative Example 2.

Result 2: standard deviation percentages of current in high resistance state (HRS), wherein a lower standard deviation percentage means less noise during high-temperature reading.

Figure 6:
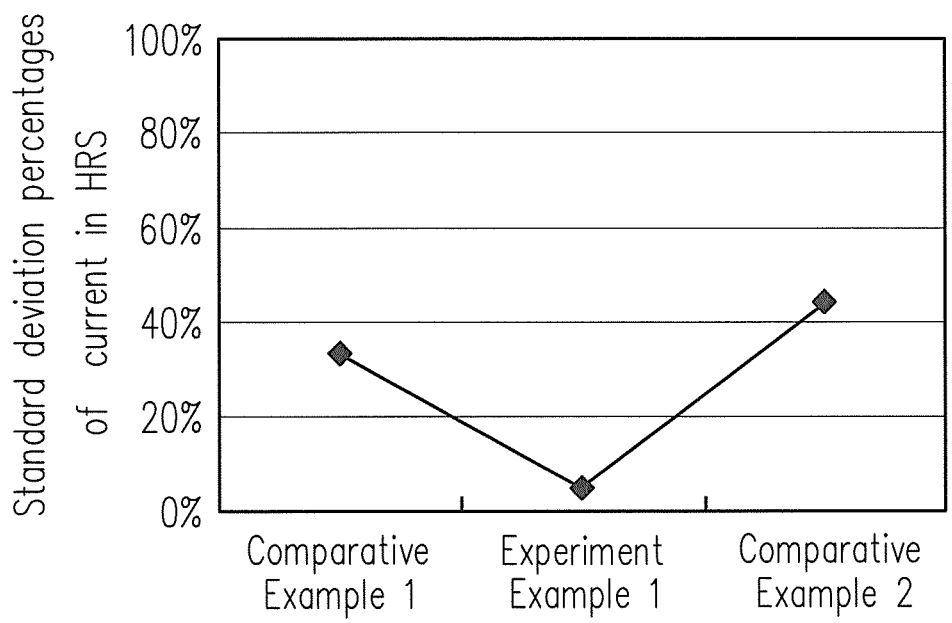
FIG. 6 is a comparative curve diagram of the Experiment Example 1, the Comparative Example 1 and the Comparative Example 2 with respect to standard deviation percentages of current in a high resistance state.

After high-temperature thermal treatment (i.e. baking), the current in HRS is measured for 21 times, and the results are shown in terms of standard deviation percentages in FIG. 6.

It is learned from FIG. 6 that the standard deviation percentages of the current in HRS in the Experiment Example 1 of the invention is obviously lower than the Comparative Examples 1 and 2.

In view of the above, by means of the metal oxynitride layer formed on the surface of the activated metal layer, not only the diffusion of the oxygen ions in the activated metal layer to the electrode is blocked, which thereby enhances data retention, but the impact on electric conduction of the memory is also reduced by means of the extra-thin metal oxynitride layer.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A resistive RAM, comprising:
a first electrode;
a second electrode;
a transition metal oxide (TMO) layer between the first electrode and the second electrode;
an activated metal layer between the first electrode and the TMO layer;
a first metal oxynitride layer formed on a surface of the activated metal layer in a gas environment containing oxygen and nitrogen elements; and
a second metal oxynitride layer disposed between the second electrode and the TMO layer in the gas environment containing oxygen and nitrogen elements.

2. The resistive RAM as claimed in claim 1, wherein a thickness of the first metal oxynitride layer is from 1 nm to 20 nm.

3. The resistive RAM as claimed in claim 1, wherein a material of the activated metal layer comprises Ti, Ta, W, Hf, Ni, Al, V, Co, Zr or Si.

4. The resistive RAM as claimed in claim 1, wherein the material of the first electrode is the same as the material of the activated metal layer.

5. The resistive RAM as claimed in claim 1, further comprising a first buffer layer disposed between the TMO layer and the first metal oxynitride layer.

6. The resistive RAM as claimed in claim 5, wherein a material of the first electrode is the same as a material of the first buffer layer.

7. The resistive RAM as claimed in claim 5, wherein the activated metal layer further comprises a second buffer layer, disposed on the surface of the activated metal layer and contacting the second metal oxynitride layer directly.

8. A method of manufacturing a resistive RAM, comprising:
forming a first electrode;
forming a first metal oxynitride layer on a surface of the first electrode in a gas environment containing oxygen and nitrogen elements;
forming a transition metal oxide (TMO) layer on the first electrode metal oxynitride layer;
forming an activated metal layer on the TMO layer;
forming a second metal oxynitride layer on a surface of the activated metal layer in the gas environment containing oxygen and nitrogen elements; and
forming a second electrode on the second metal oxynitride layer.

9. The method of manufacturing the resistive RAM as claimed in claim 8, wherein the gas is at least one selected from the group consisting of $N_2O$, $NO_2$, $NO$, $N_2O_2$, $N_2/O_2$, $N_2/O_3$, $N_2$, $NH_3$, $O_2$, $H_2O$, $H_2O_2$ and $O_3$.

10. The method of manufacturing the resistive RAM as claimed in claim 8, wherein the step of forming the first metal oxynitride layer and the second metal oxynitride layer is performed with plasma.

11. The method of manufacturing the resistive RAM as claimed in claim 8, after forming the first metal oxynitride layer, further comprising the step of forming a first buffer layer on the first metal oxynitride layer.

12. The method of manufacturing the resistive RAM as claimed in claim 8, wherein the step of forming the activated metal layer further comprises forming a second buffer layer on the surface of the activated metal layer.

* * * * *